US006858451B2

(12) United States Patent
Suzuki et al.

(10) Patent No.: US 6,858,451 B2
(45) Date of Patent: Feb. 22, 2005

(54) METHOD FOR MANUFACTURING A DYNAMIC QUANTITY DETECTION DEVICE

(75) Inventors: Yasutoshi Suzuki, Okazaki (JP); Shinji Yoshihara, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/419,230

(22) Filed: Apr. 21, 2003

(65) Prior Publication Data

US 2003/0203528 A1 Oct. 30, 2003

(30) Foreign Application Priority Data

Apr. 24, 2002 (JP) ........................................ 2002-122009

(51) Int. Cl.$^7$ .......................... G01R 31/26; H01L 21/66
(52) U.S. Cl. ............................... 438/14; 438/11; 438/15; 438/18; 257/48
(58) Field of Search .............................. 438/14, 11, 15, 438/18; 257/48

(56) References Cited

U.S. PATENT DOCUMENTS

| | | | | |
|---|---|---|---|---|
| 5,107,710 A | * | 4/1992 | Huck et al. | 73/708 |
| 5,643,803 A | | 7/1997 | Fukada et al. | |
| 5,654,244 A | * | 8/1997 | Sakai et al. | 438/53 |
| 5,766,344 A | * | 6/1998 | Zhang et al. | 117/103 |
| 6,127,629 A | * | 10/2000 | Sooriakumar et al. | 174/52.3 |
| 6,192,757 B1 | * | 2/2001 | Tsang et al. | 73/514.32 |
| 6,218,717 B1 | * | 4/2001 | Toyoda et al. | 257/419 |
| 6,422,088 B1 | * | 7/2002 | Oba et al. | 73/754 |
| 6,595,065 B2 | * | 7/2003 | Tanizawa et al. | 73/720 |
| 6,658,948 B2 | * | 12/2003 | Yoshihara et al. | 73/862.628 |
| 6,667,683 B1 | * | 12/2003 | Emili et al. | 338/195 |
| 2001/0028072 A1 | * | 10/2001 | Aoki et al. | 257/254 |
| 2001/0039837 A1 | * | 11/2001 | Tanizawa et al. | 73/715 |
| 2002/0053916 A1 | * | 5/2002 | Tanizawa | 324/713 |
| 2002/0083776 A1 | * | 7/2002 | Tanizawa | 73/753 |
| 2002/0100948 A1 | * | 8/2002 | Yoshihara et al. | 257/415 |
| 2002/0167058 A1 | * | 11/2002 | Toyoda et al. | 257/417 |

FOREIGN PATENT DOCUMENTS

| | | |
|---|---|---|
| EP | 56508-D E | 6/2002 |
| JP | A-05-074713 | 3/1993 |
| JP | A-11-153503 | 6/1999 |
| JP | A-2000-241273 | 9/2000 |
| JP | A-2001-343300 | 12/2001 |

OTHER PUBLICATIONS

T. Bradley, "Piezoresistive Characteristics of Short–Channel MOSFETs on (100) Silicon", *IEEE Transactions on Electron Devices*, vol. 48, No. 9, Sep. 2001, pp. 2009–2015.

Hiroya Ikeda, "Initial Oxidation Processes amd Local Bonding Structures on H–terminated Si (100) Surfaces", *Hyomen Kagaku*, vol. 17, No. 3, 1996, pp. 141–147.

* cited by examiner

*Primary Examiner*—Matthew Smith
*Assistant Examiner*—Granvill D. Lee, Jr.
(74) *Attorney, Agent, or Firm*—Posz & Bethards, PLC

(57) ABSTRACT

A method for manufacturing a dynamic quantity detection device that is formed by bonding a semiconductor chip that includes a detection element for detecting a dynamic quantity to a stand using a bonding layer includes: forming a semiconductor chip that includes a detection element used for correlating a dynamic quantity to be detected to an electric quantity and a plurality of processing circuit elements used for making up a circuit that processes the electric quantity; placing a bonding layer on a stand; placing the semiconductor chip on the bonding layer; bonding the semiconductor chip to the stand by sintering the bonding layer; and annealing the semiconductor chip in an atmosphere that contains hydrogen in order to cure a change, which is caused during the bonding of the semiconductor chip, in a characteristic of one of the processing circuit elements.

10 Claims, 10 Drawing Sheets

METHOD FOR MANUFACTURING A DYNAMIC QUANTITY DETECTION DEVICE

CROSS REFERENCE TO RELATED APPLICATION

This application is based on and incorporates herein by reference Japanese Patent Application No. 2002-122009 filed on Apr. 24, 2002.

BACKGROUND OF THE INVENTION

The present invention relates to a method for manufacturing a dynamic quantity detection device that is formed by bonding a semiconductor chip that includes a detection element for detecting a dynamic quantity to a stand using a bonding layer.

The publication JP-A-2000-241273 discloses such a method in the manufacturing process of a discrete pressure detection device 100 shown in FIGS. 1A and 1B.

As shown in FIGS. 1A and 1B, the discrete pressure detection device 100 includes a metal stem 20, a discrete semiconductor chip 30, and a glass layer 40. The metal stem 20 includes a disk-like diaphragm 10. The semiconductor chip 30 is bonded to the diaphragm 10 with the glass layer 40. The discrete semiconductor chip 30 is in contact with the glass layer 40 at a first surface 31 of the discrete semiconductor chip 30. The diaphragm 10 is in contact with the glass layer 40 at a first surface 11 of the diaphragm 10. The discrete semiconductor chip 30 includes four gauges (detection elements) 51, 52, 53, 54, or four piezo resistors 51, 52, 53, 54. The gauges 51, 52, 53, 54 are located in a second surface 32 of the chip 30, which is opposite to the first surface 31. The glass layer 40 is, for example, made of a low melting point glass.

When a medium that transmits pressure to be detected is introduced into the stem 20 to apply the pressure to a second surface 12 of the diaphragm 10, which is opposite to the first surface 11, the diaphragm 10 deforms and the discrete semiconductor chip 30 synchronously deforms to change the resistances of the gauges 51, 52, 53, 54. The resistance changes are processed by a processing circuit, which is not shown in the figure, in order to detect the pressure. The processing circuit is provided in another chip outside the discrete semiconductor chip 30 and includes processing circuit elements such as a bi-polar transistor and a trimming resistor.

Because the processing circuit is located in another chip, the system that includes the discrete pressure detection device 100 and the chip including the processing circuit is relatively bulky. To address the issue of the bulkiness of the system, the inventors of the present invention attempted to integrate gauges 51, 52, 53, 54 and processing circuit elements for making up a processing circuit equivalent to the foregoing processing circuit in an intelligent semiconductor chip 33 and to form an intelligent pressure detection device 101, which is shown in FIGS. 2A and 2B. The processing circuit elements are included in a processing circuit area 70.

However, it turned out that the following issue was caused when the intelligent pressure detection device 101 was manufactured using the intelligent semiconductor chip 33. When the discrete pressure detection device 100 of FIGS. 1A and 1B is manufactured, the discrete semiconductor chip 30 is normally bonded to the metal stem 20 by sintering the glass layer 40. However, when the glass layer 40 was sintered, the characteristics of a bi-polar transistor, which is included in the processing circuit area 70 as a processing circuit element, changed.

The characteristics change of the bi-polar transistor may be caused by the following mechanism. Although not shown in the figure, the intelligent semiconductor chip 33 includes a substrate, which is made of silicon. Wiring lines, which electrically interconnect elements such as a bi-polar transistor located in a surface of the substrate, an oxide film, which insulates the wiring lines, and a passivation film, which protects the wiring lines and the oxide film, are located on the surface of the substrate. The oxide film and the passivation film are formed in the atmosphere that contains hydrogen in the wafer manufacturing process, in which a wafer is processed for manufacturing the intelligent semiconductor chip 33.

When the oxide film and the passivation film are formed, the hydrogen in the atmosphere is absorbed into the oxide film and the passivation film as hydrogen ions. The dangling bonds of the silicon atoms located at the interface between the surface of the substrate and the oxide film are terminated by the hydrogen ions. At a subsequent step in the wafer manufacturing process, the wafer is heated at a high temperature in the atmosphere that contains hydrogen. During the step, the amount of hydrogen ions in the oxide film and the passivation film can increase as hydrogen in the atmosphere is absorbed, and the bonds between the hydrogen-terminated silicon atoms and the terminating hydrogen atoms at the interface between the surface of the substrate and the oxide film may be broken due to the high temperature.

At a later step, the wafer is diced to form the intelligent semiconductor chip 33. Because no heat is applied to the intelligent semiconductor chip 33 during the dicing step, the characteristics of the bi-polar transistor such as current amplification factor in the wafer manufacturing process is substantially determined by the concentration of the hydrogen ions resulting from the above high temperature treatment.

However, when the glass layer 40 is sintered for bonding the intelligent semiconductor chip 33 to the metal stem 20, the processing circuit area 70 is heated. As a result, the hydrogen atoms bonded to the silicon atoms at the interface between the surface of the substrate and the oxide film move away from the silicon atoms, and the hydrogen ions absorbed in the oxide film migrate toward the passivation film or get outgassed into the atmosphere.

As a result, electrons trapped by the hydrogen atoms included in the oxide film are released above the surface of the bi-polar transistor located in the processing circuit area 70, and the transistor injection efficiency increases. Consequently, the base current goes up, and the collector current also goes up among the currents that flow through the base, the emitter, and the collector of the bi-polar transistor. Thus, the current amplification factor, which is one of the characteristics of the bi-polar transistor, goes up.

SUMMARY OF THE INVENTION

The present invention has been made in view of the above issue caused by bonding a semiconductor chip, which includes a detection element used for correlating a dynamic quantity to be detected to an electric quantity and a plurality of processing circuit elements used for making up a circuit that processes the electric quantity, to a stand using a bonding layer in a manufacturing process of a dynamic quantity detection device. An object of the present invention is to address the change in a characteristic of one of the processing circuit elements, which is caused when the bonding layer is wintered to bond the semiconductor chip to the stand.

To achieve the object, a first method according to the present invention for manufacturing a dynamic quantity detection device includes: forming a semiconductor chip that includes a detection element used for correlating a dynamic quantity to be detected to an electric quantity and a processing circuit element used for making up a circuit that processes the electric quantity; placing a bonding layer on a stand; placing the semiconductor chip on the bonding layer; bonding the semiconductor chip to the stand by sintering the bonding layer; and annealing the semiconductor chip in an atmosphere that contains hydrogen in order to cure a change, which is caused during the bonding of the semiconductor chip, in a characteristic of one of the processing circuit elements.

According to the first method, the semiconductor chip is annealed in an atmosphere that contains hydrogen, so even if the hydrogen contained in the semiconductor chip move away during the bonding of the semiconductor chip, it is possible to supply hydrogen. Consequently, the change in the amount of the hydrogen contained in the semiconductor chip is suppressed. Therefore, it is possible to suppress the change in the characteristic of one of the processing circuit elements.

A second method according to the present invention for manufacturing a dynamic quantity detection device includes: forming a semiconductor chip that includes a detection element used for correlating a dynamic quantity to be detected to an electric quantity and a plurality of processing circuit elements used for making up a circuit that processes the electric quantity; placing a bonding layer on a stand; placing the semiconductor chip on the bonding layer; bonding the semiconductor chip to the stand by sintering the bonding layer; and compensating a change, which is caused during the bonding of the semiconductor chip, in a characteristic of one of the processing circuit elements by trimming.

According to the second method, the change in the characteristic of one of the processing circuit elements is compensated by trimming. As a result, it is possible to achieve the same effect that is achieved by the first method.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 3A:
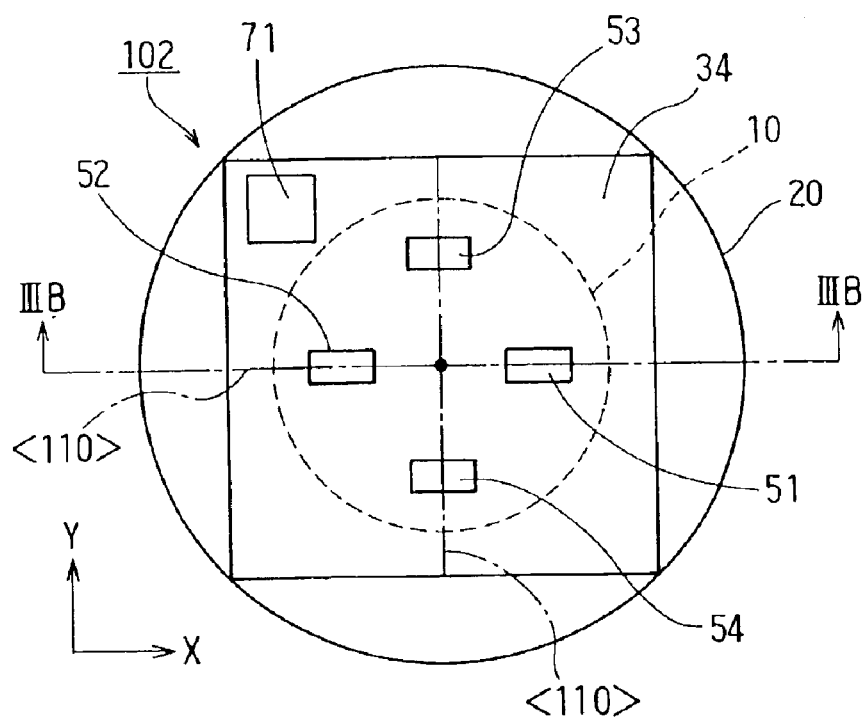
FIG. 3A is a plan view of a pressure detection device manufactured with a method according to a first embodiment of the present invention.
Figure 3B:
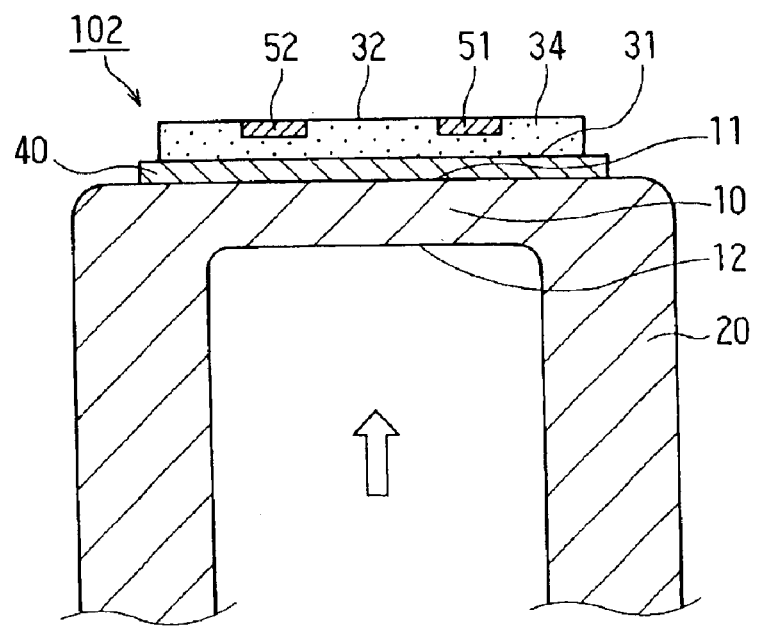
FIG. 3B is a cross-sectional view of the device of FIG. 3A taken along the line IIIB—IIIB in FIG. 3A.

The present invention will be described in detail with reference to a various embodiments. As shown in FIGS. 3A and 3B, a dynamic quantity detection device according to a first embodiment is an intelligent pressure detection device 102. The pressure detection device 102 of FIGS. 3A and 3B is used, for example, for controlling the fuel injection pressure in an engine or the brake pressure for the wheels of a vehicle.

As shown in FIGS. 3A and 3B, the device 102 includes a metal stem 20 (stand), an intelligent semiconductor chip 34, and a glass layer 40. The metal stem 20 includes a disk-like diaphragm 10. The chip 34 is bonded to the diaphragm 10 using the glass layer 40. The chip 34 is in contact with the glass layer 40 at a first surface 31 of the chip 34. The diaphragm 10 is in contact with the glass layer 40 at a first surface 11 of the diaphragm 10. The chip 34 includes four rectangular gauges (detection elements) 51, 52, 53, 54, or four piezo resistors 51, 52, 53, 54, and processing circuit elements.

Although not shown in the figure, the gauges 51, 52, 53, 54 are electrically interconnected by wiring lines to form a bridge circuit. The processing circuit elements are used for making up a circuit for processing an electric quantity such as current and potential outputted from the bridge circuit. As shown in FIGS. 3A and 3B, the gauges 51, 52, 53, 54 are located in a second surface 32 of the chip 34, which is opposite to the first surface 31, above the diaphragm 10. The processing circuit elements are included in a processing circuit area 71, which is located in the second surface 32 of the chip 34.

When a medium such as gas and liquid that transmits, for example, the fuel injection pressure in an engine is introduced into the stem 20 to apply the pressure to a second surface 12 of the diaphragm 10, which is opposite to the first surface 11, the diaphragm 10 deforms and the chip 34 synchronously deforms to change the resistances of the gauges 51, 52, 53, 54. The resistance changes vary the electric quantity outputted from the bridge circuit, and the electric quantity is processed by the circuit included in the processing circuit area 71 in order to detect the pressure.

The metal stem 20 is formed in the shape of a hollow cylinder by, for example, cutting. The metal stem 20 is made of, for example, KOVAR, which is a Fe—Ni—Co alloy having a thermal expansion coefficient approximately equal to that of a glass. The diaphragm 10 is located on a first end of the metal stem 20. The medium, which transmits pressure, is introduced from a second end of the metal stem 20, which is not shown in the figure but is opposite to the first end, in a direction shown by the arrow in FIG. 3B in order to apply pressure to the second surface 12 of the diaphragm 10. The dimensions of the metal stem 20 are, for example, 6.5 mm for the outer diameter and 2.5 mm for the inner diameter. The thickness of the diaphragm 10 is 0.65 mm if the maximum detected pressure is, for example, 20 Mpa, and 1.40 mm if the maximum detected pressure is, for example, 200 MPa.

Figure 4:
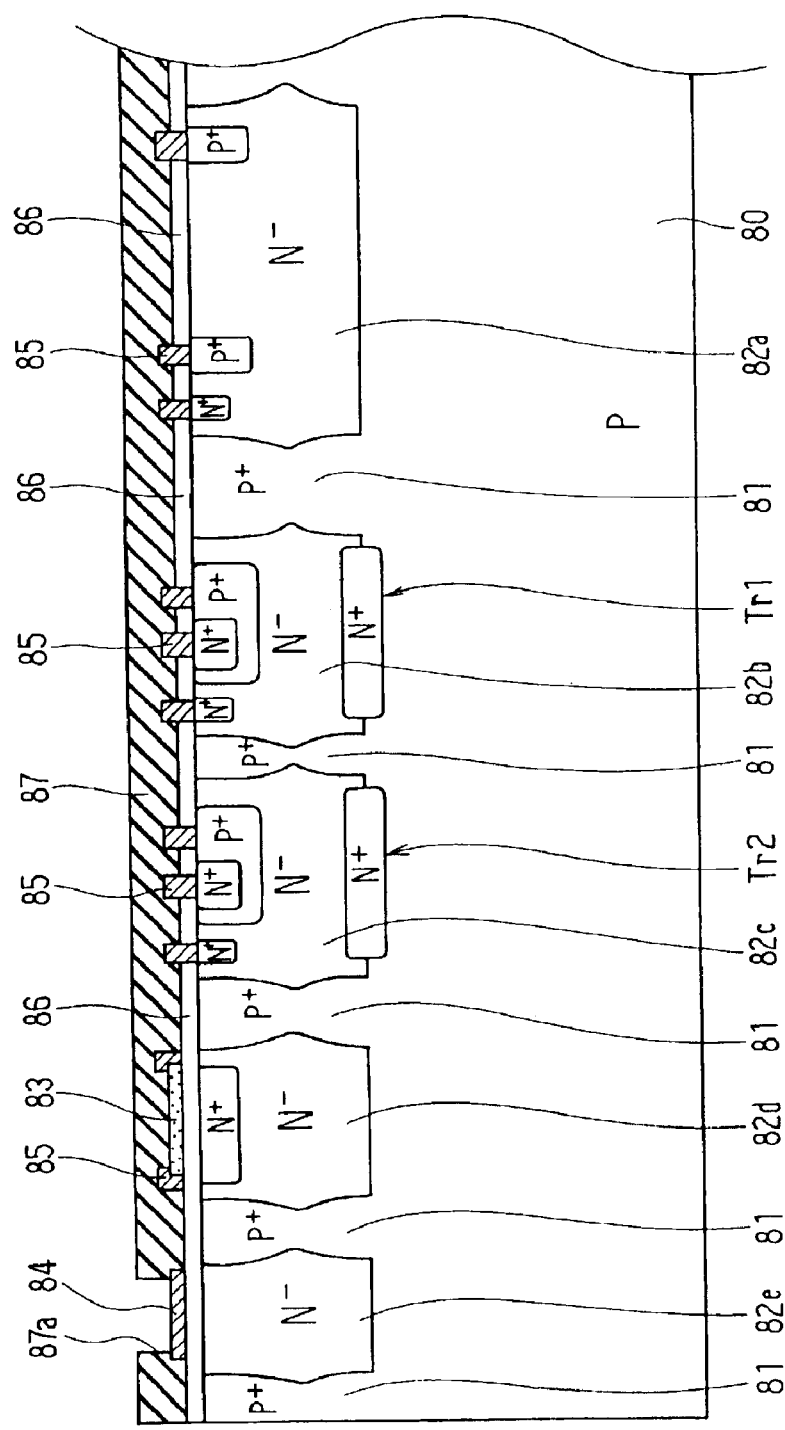
FIG. 4 is a partial cross-sectional view of the semiconductor chip in FIGS. 3A and 3B.

As shown in FIG. 4, the semiconductor chip 34 includes a plate-like p-type single crystal silicon substrate 80 that has a uniform thickness. The surface of the silicon substrate 80 that is located on the side of the second surface 32 of the chip 34 is planar and has a face orientation of (100). The dimensions of the semiconductor chip 34 are, for example, 4.0 mm×4.0 mm for the length and width of the planar surface and 0.2 mm for the thickness. The glass layer 40 is made of, for example, a low melting point glass. The thickness of the glass layer 40 is, for example, 0.06 mm.

The surface of the silicon substrate 80 has a face orientation of (100), so the substrate 80 has two crystallographic axes of <110>, which are orthogonal to each other and parallel to the surface of the silicon substrate 80, as shown in FIG. 3A. In FIG. 3A, one of the crystallographic axes of <110> is parallel to the X-axis, while the other orientation axis <110> is parallel to the Y-axis. As shown in FIG. 3A, the gauges 51, 52, 53, 54 are arranged such that the longitudinal directions of them are parallel to the X-axis, while the lateral directions of them are parallel to the Y-axis.

The processing circuit elements, which are located in the processing circuit area 71 in the second surface 32 of the semiconductor chip 34, are ones such as a bi-polar transistor and a trimming resistor. Although not shown in the figure, the processing circuit elements are electrically connected to the gauges 51, 52, 53, 54 by wiring lines.

Next, the cross-sectional structure of the semiconductor chip 3 will be described in detail. As shown in FIG. 4, a plurality of n⁻ epitaxial regions 82a, 82b, 82c, 82d, 82e, which are isolated from one another by p⁺ isolating regions 81, are located in the surface of the semiconductor substrate 80. The gauges 51, 52, 53, 54 are located in the surface of one of the epitaxial regions 82a.

As shown in FIG. 4, two transistors Tr1, Tr2 for making up an operational amplifier are formed using two of the epitaxial regions 82b, 82c, respectively. A trimming resistor 83, which is used for adjusting the characteristics of the operational amplifier, is located on one of the epitaxial regions 82d. The trimming resistor 83 is made of, for example, chrome silicon (CrSi). An electrode pad 84, which is used for electrically connecting the semiconductor chip 30 to an external circuit, is located on one of the epitaxial regions 82e. The electrode pad 84 is made of, for example, aluminum. The transistors Tr1, Tr2, the trimming resistor 83, and the electrode pad 84 are included in the processing circuit area 71.

Although not illustrated in the figure, other epitaxial regions are located in the surface of the semiconductor substrate 80 and also electrically isolated from one another by other p⁺ isolation regions 81. Other resistors and transistors are located in the other epitaxial regions.

Figure 2A:
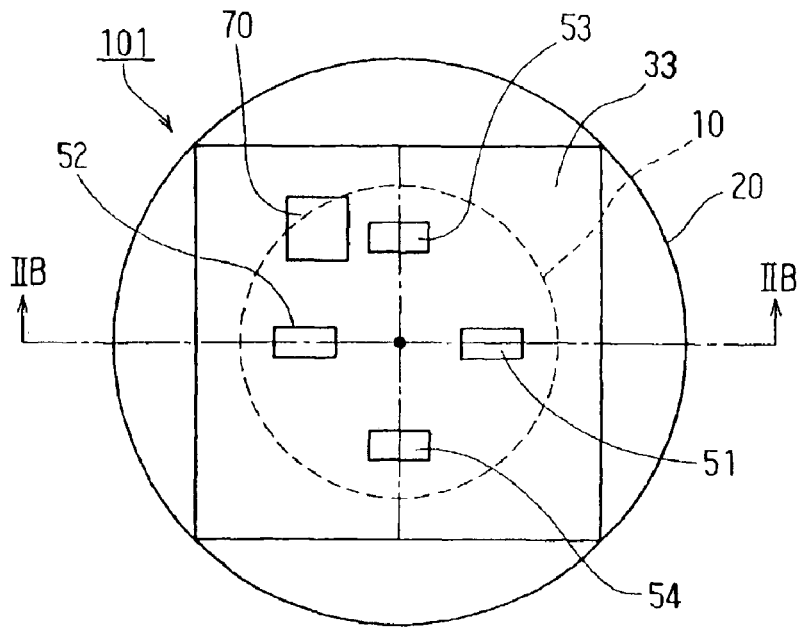
FIG. 2A is a plan view of a pressure detection device, in which a semiconductor chip including processing circuit elements has been bonded to a stand using the same method used for the proposed device of FIGS. 1A and 1B.
Figure 2B:
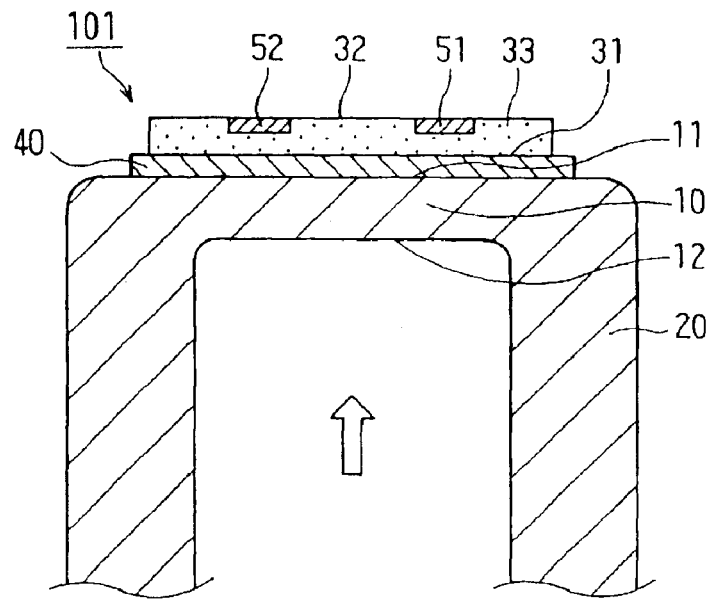
FIG. 2B is a cross-sectional view of the device in FIG. 2A taken along the line IIB—IIB.

A silicon oxide film ($SiO_2$) 86 are located on the surface of the semiconductor substrate 80. Aluminum wiring lines 85, which electrically interconnect the gauges 51, 52, 53, 54, the transistors Tr1, Tr2, the trimming resistor 83, and the electrode pad 84, are insulated from the semiconductor substrate 80 at their predetermined portions by the silicon oxide film 86. A passivation film 87, which is a protective film, is located on the aluminum wiring lines 85 and the silicon oxide film 86. The passivation film 87 has an opening 87a for wire bonding, as shown in FIG. 2. The passivation film 87 is made of, for example, a plasma silicon nitride film (P—SiN).

Next, a method for manufacturing the pressure detection device 102 of FIGS. 3A and 3B will be briefly described. The pressure detection device 102 of FIGS. 3A and 3B is manufactured according to the process flow shown in FIG. 5. Firstly, as a preparing step, a semiconductor chip 34 that includes gauges 51, 52, 53, 54 and processing circuit elements, which are ones such as a transistor Tr1, Tr2 and a trimming resistor 83, and a metal stem 20 are prepared. Then, as an arranging step, a glass layer 40 that is made of, for example, a low melting point glass is placed at a predetermined position on a first surface 11 of a diaphragm 10 of the metal stem 20, and the semiconductor chip 34 is placed on top of the glass layer 40.

Figure 6:
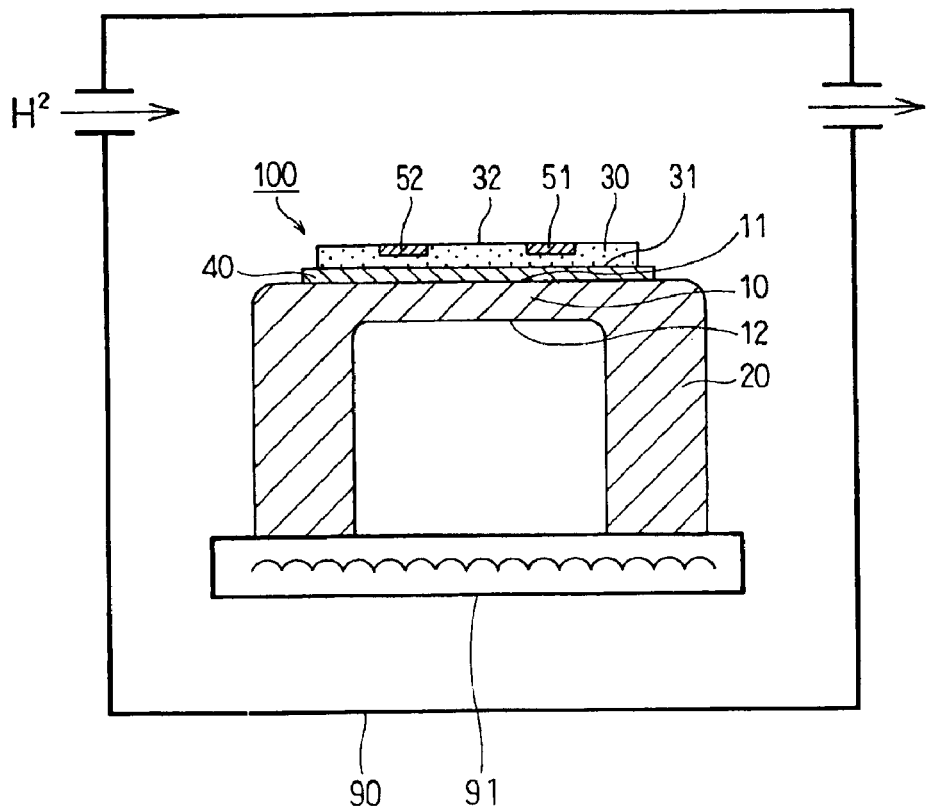
FIG. 6 is a schematic view showing an annealing method according to the first embodiment.

Then, as a bonding step, the combined unit 20, 40, 34 is transferred into a sintering furnace, which is not shown in the figure, and the glass layer 40 is sintered at approximately 400° C. to bond the semiconductor chip 34 to the metal stem 20. Finally, as an annealing step, the sintered combined unit 20, 40, 34 is transferred into annealing chamber 90 as shown in FIG. 6, placed on a heater panel 91, and annealed by heating, for example, at 380° C. for 30 minutes on the heater panel 91 while a gas containing hydrogen is supplied. With the above steps, the pressure detection device 102 of FIGS. 3A and 3B is formed.

Next, the pressure detection mechanism in the pressure detection device 102 of FIGS. 3A and 3B will be described in detail. When a medium that transmits pressure to be detected is introduced into the stem 20 to apply the pressure to the second surface 12 of the diaphragm 10, the diaphragm 10 strains and the semiconductor chip 34 also strains synchronously. As a result, a stress is generated in the semiconductor chip 34. At that time, stresses are generated along X-axis and Y-axis of FIG. 3A, which are respectively parallel to two <110> crystallographic axes of the semiconductor chip 34, in each of the gages 51, 52, 53, 54.

Figure 7A:
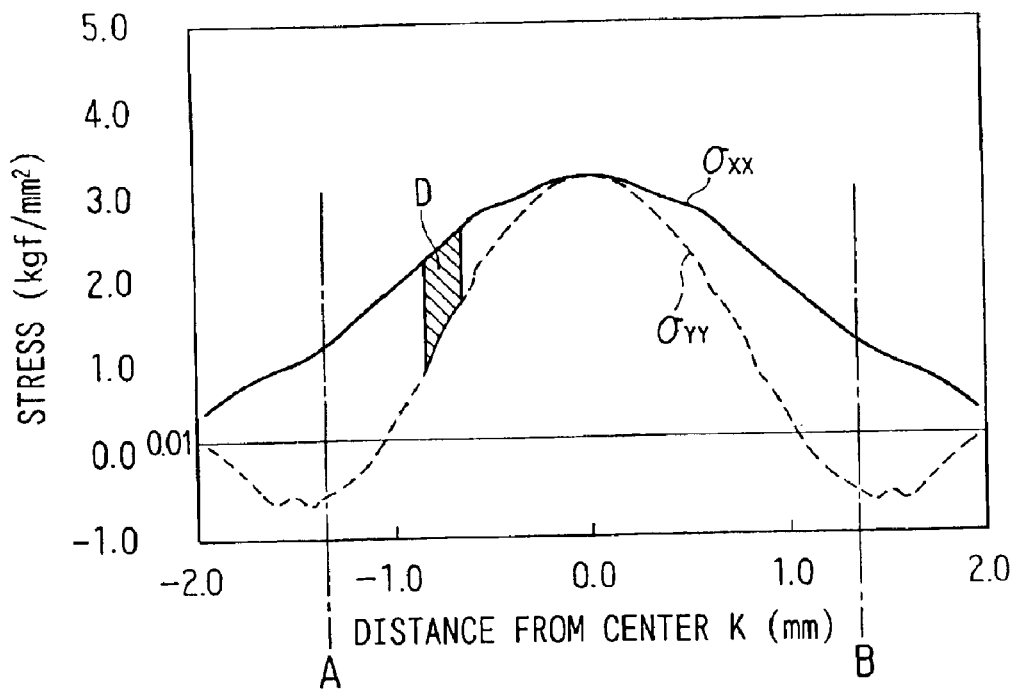
FIGS. 7A and 7B are views for showing the stress distribution in the semiconductor chip in FIGS. 3A and 3B.
Figure 7B:
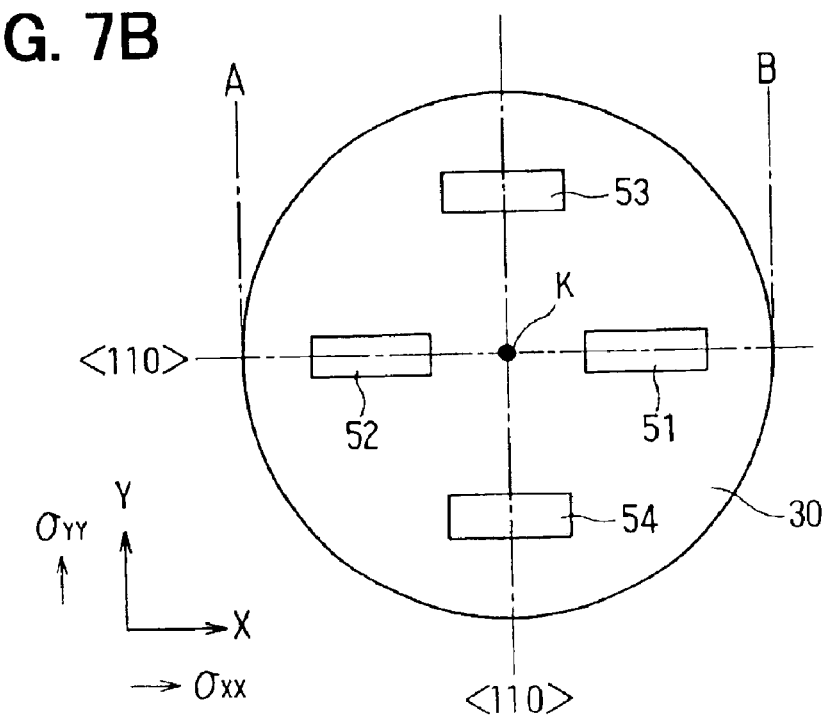

When a pressure is applied to the second surface 12 of the diaphragm 10, the stresses generated in the semiconductor chip 34 at the portion located above the diaphragm 10 have the distributions shown in FIGS. 7A and 7B. In FIG. 7A, $\sigma_{xx}$, which is illustrated in solid line, and $\sigma_{yy}$, which is illustrated in dashed line, express the magnitude of the stress along X-axis and that along Y-axis, respectively. As shown in FIG. 7A, $\sigma_{yy}$ decreases more steeply as the distance from the center K increases than $\sigma_{xx}$ does, although both $\sigma_{xx}$ and $\sigma_{yy}$ decrease as the distance from the center K increases.

An electric quantity corresponding to the difference D between $\sigma_{xx}$ and $\sigma_{yy}$ can be outputted from a bridge circuit that is made up of the gauges 51, 52, 53, 54. The electric quantity is approximately proportionate to the difference D between $\sigma_{xx}$ and $\sigma_{yy}$. Therefore, the pressure applied to the second surface 12 of the diaphragm 10 can be precisely detected.

the silicon substrate 80 included in the semiconductor chip 34 has a (100) face orientation, so two crystallographic axes of <110>, which are orthogonal to each other and have high stress sensitivity, are located on the surface of the silicon substrate 80. In addition, each of the gauges 51, 52, 53, 54 has two kinds of stress levels, $\sigma_{xx}$ and $\sigma_{yy}$. Therefore, it is possible to detect the pressure on the basis of the above-mentioned detection mechanism.

Figure 1A:
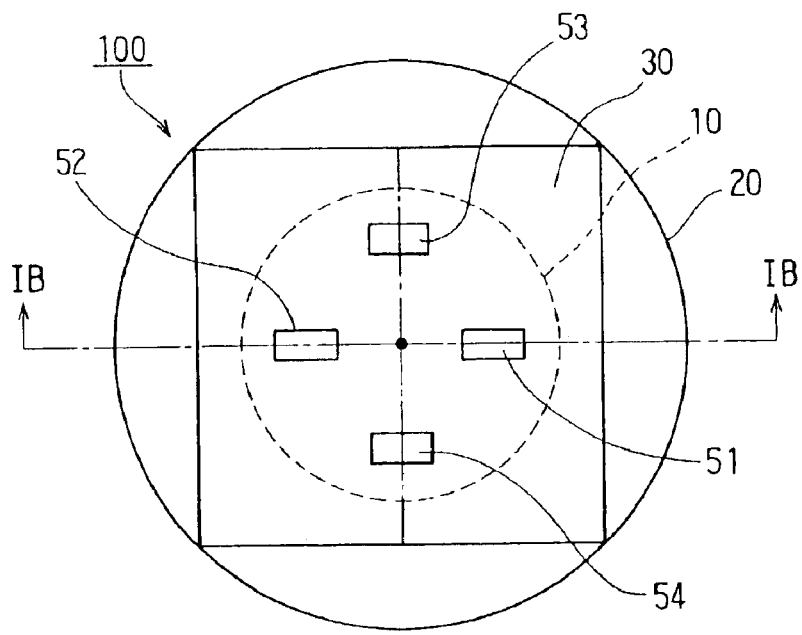
FIG. 1A is a plan view of a proposed pressure detection device.
Figure 1B:
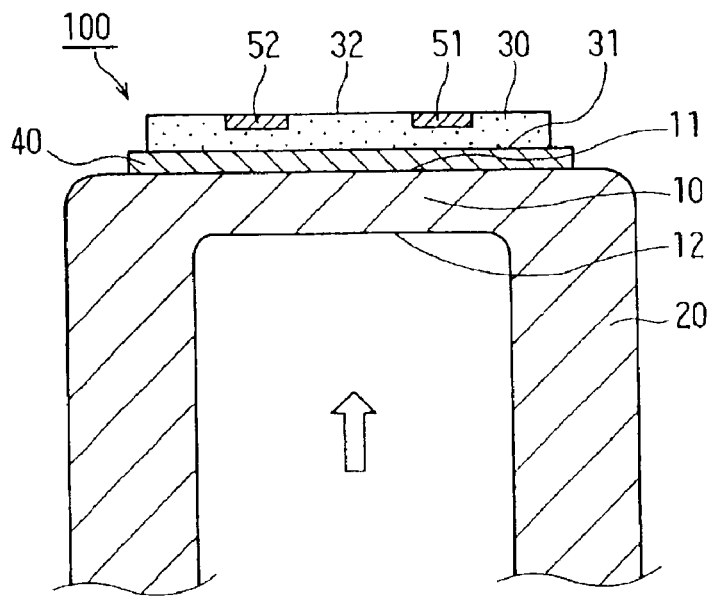
FIG. 1B is a cross-sectional view of the device of FIG. 1A taken along the line IB—IB.

As shown in FIG. 3A, the gauges 51, 52, 53, 54 and the processing circuit elements, which are included in the processing circuit area 71, are integrated in the semiconductor chip 34 of the pressure detection device 102. Therefore, it is possible to make a system that includes the intelligent pressure detection device 102 of FIGS. 3A and 3B smaller than a system that includes the discrete pressure detection device 100 of FIGS. 1A and 1B.

In the manufacturing process of the pressure detection device 102 of FIGS. 3A and 13B, the semiconductor chip 34 is annealed after the glass layer 40 is sintered. However, if the semiconductor chip 34 was not annealed, the characteristics of the transistor Tr1, Tr2, which are included in the processing circuit area 71 as the processing circuit elements, would change due to the following reasons.

As described, the semiconductor chip 34 includes the p-type single crystal silicon substrate 80, and the aluminum lines 85, the silicon oxide film 86, and the passivation film 87 are located on the surface of the substrate 80. The silicon oxide film 86 and the passivation film 87 are formed in the atmosphere that contains hydrogen in the wafer manufacturing process, in which a wafer is processed for manufacturing the semiconductor chip 34. When the silicon oxide film 86 and the passivation film 87 are formed, the hydrogen in the atmosphere is absorbed into the silicon oxide film 86 and the passivation film 87 as hydrogen ions. The dangling bonds of the silicon atoms located at the interface between the surface of the substrate 80 and the silicon oxide film 86 are terminated by the hydrogen ions. At a subsequent step in the wafer manufacturing process, the wafer is heated at a high temperature in the atmosphere that contains hydrogen. During the step, the amount of hydrogen ions in the silicon oxide film 86 and the passivation film 87 can increase as hydrogen in the atmosphere is absorbed, and the bonds between the hydrogen-terminated silicon atoms and the terminating hydrogen atoms at the interface between the surface of the substrate 80 and the silicon oxide film 86 may be broken due to the high temperature.

At a later step, however, when the glass layer 40 is sintered, the hydrogen atoms bonded to the silicon atoms at the interface between the surface of the substrate 80 and the silicon oxide film 86 would move away from the silicon atoms, and the hydrogen ions absorbed in the silicon oxide film 86 would migrate toward the passivation film 87 or get outgassed into the atmosphere.

As a result, electrons trapped by the hydrogen atoms included in the silicon oxide film 86 would be released above the surface of the transistors Tr1, Tr2, which are included in the processing circuit area 71, and the transistor injection efficiency of the transistors Tr1, Tr2 would increase. Consequently, the base current would go up, and the collector current would also go up among the currents that flow through the base, the emitter, and the collector of any of the transistors Tr1, Tr2. Thus, the current amplification factor, which is one of the characteristics of the transistors Tr1, Tr2, would go up.

Because of the above-mentioned characteristics change of the transistors Tr1, Tr2, the transistors Tr1, Tr2 would have characteristics different from each other, if the transistors Tr1 Tr2 are placed far apart. As a result, the parity in the operational amplifier, which is formed by the transistors Tr1, Tr2, would be lost, and the characteristics of the operational amplifier would worsen.

Figure 5:
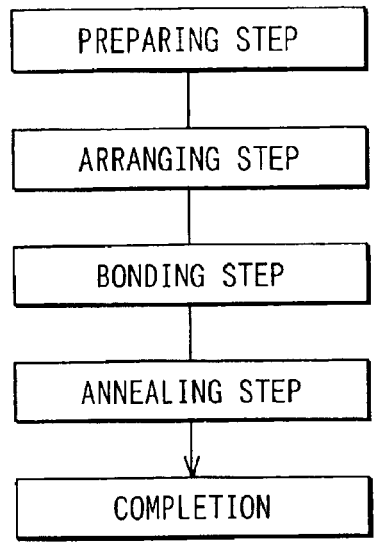
FIG. 5 is a flow chart showing the manufacturing flow for the pressure detection device of FIGS. 3A and 3B.

To address the above problem, as shown in FIGS. 5 and 6, after the glass layer 40 is sintered, the semiconductor chip 34 is annealed by heating on the heater panel 91 while a gas containing hydrogen is supplied into the annealing chamber 90 in the manufacturing process of the pressure detection device 102 of FIGS. 3A and 3B. Thus, even if the hydrogen atoms bonded to the silicon atoms at the interface between the surface of the substrate 80 and the silicon oxide film 86 move away from the silicon atoms and the hydrogen ions absorbed in the silicon oxide film 86 migrate toward the passivation film 87 or get outgassed into the atmosphere, it is possible to supply hydrogen ions to the silicon oxide film 86 during the annealing step.

As a result, it is possible to suppress the reduction of the amount of the hydrogen ions contained in the silicon oxide film 86. Therefore, it is possible to suppress the change in the transistor injection efficiency of the transistors Tr1, Tr2. As a result, it is possible to suppress the change in the base currents in the transistors Tr1, Tr2. Thus, it is also possible to suppress the change in the current amplification factors of the transistors Tr1, Tr2.

When a medium that transmits pressure to be detected applies the pressure to the diaphragm 10, the diaphragm 10 deforms and the semiconductor chip 34 synchronously deforms. At that time, however, the processing circuit area 71 also deforms, and a stress is generated in the processing circuit area 71. Due to the stress, electric fields in the transistors Tr1, Tr2, which are located in the processing circuit area 71 may be locally concentrated, and hot carrier phenomenon may be caused. That is, the carriers accelerated in the concentrated electric fields enter the silicon oxide film 86 located above the transistors Tr1, Tr2. Then, the carriers may be trapped there to change the threshold voltages of the transistors Tr1, Tr2.

To address the above problem due to hot carrier phenomenon, as shown FIG. 3A, the processing circuit area 71 is located at the periphery of the semiconductor chip 34. Specifically, the processing circuit area 71 is located outside the portion of the semiconductor chip 34 that is located above the diaphragm 10 of the metal stem 20. The stress generated in the semiconductor chip 34 is much smaller at the processing circuit area 71 than at the gauges 51, 52, 53, 54. As a result, it is possible to suppress the hot carrier phenomenon caused at the processing circuit area 71. Therefore, it is possible to further suppress characteristic change of the elements such as transistors Tr1, Tr2 located in the processing circuit area 71. As shown in FIG. 7A, it is preferred that the processing circuit area 71 be more than 2 mm distant from the center K, so that the processing circuit area 71 experiences a stress of as small as 0.01 kgf/mm$^2$.

Figure 8A:
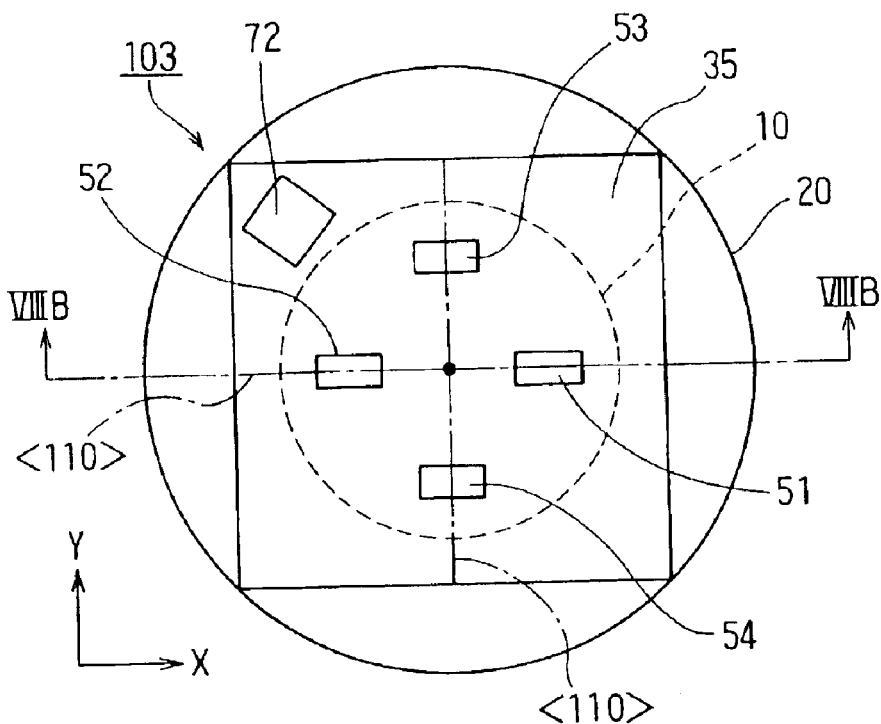
FIG. 8A is a plan view of a variation of the pressure detection device manufactured with the method according to the first embodiment, in which the orientation of a processing circuit area differs from that of the pressure detection device of FIGS. 3A and 3B.
Figure 8B:
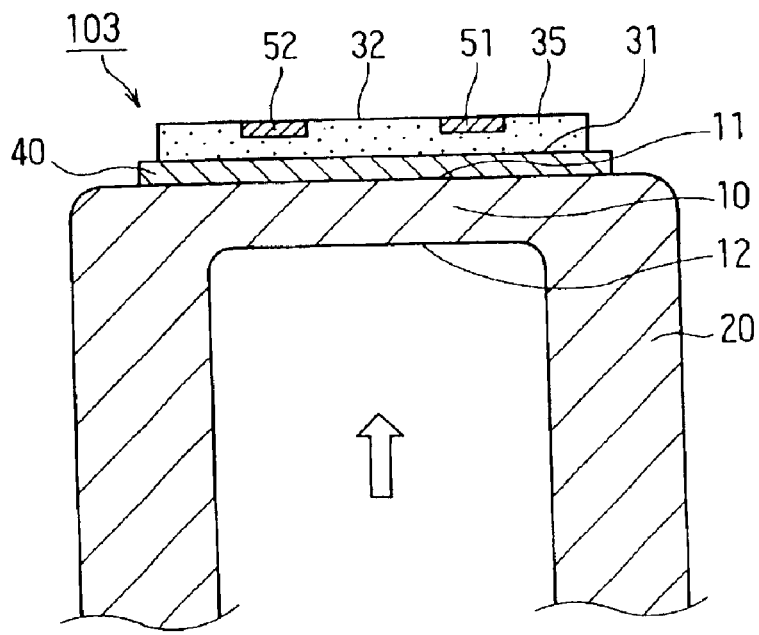
FIG. 8B is a cross-sectional view of the device of FIG. 8A taken along the line VIIIB—VIIIB in FIG. BA.

In addition, the stress generated in the silicon substrate 80 is much great along the two crystallographic axes of <110> that are parallel to the surface of the silicon substrate 80, which has a face orientation of (100). Therefore, it is preferred that the processing circuit area be arranged such that the sides of the processing circuit area have an angle of 45 degrees with respect to the two crystallographic axes of <110>, as a processing circuit area 72 of a semiconductor chip 35 in a pressure detection device 103 shown in FIGS. 8A and 8B is. In other aspects, the pressure detection device 103 of FIGS. 8A and 8B has the same structure as the pressure detection device 102 of FIGS. 3A and 3B. With the above arrangement of the processing circuit area 72, the processing circuit area 72 has relatively small stresses along the sides of it. Therefore, hot carrier phenomenon is further suppressed in the processing circuit area 72.

Second Embodiment

Figure 9A:
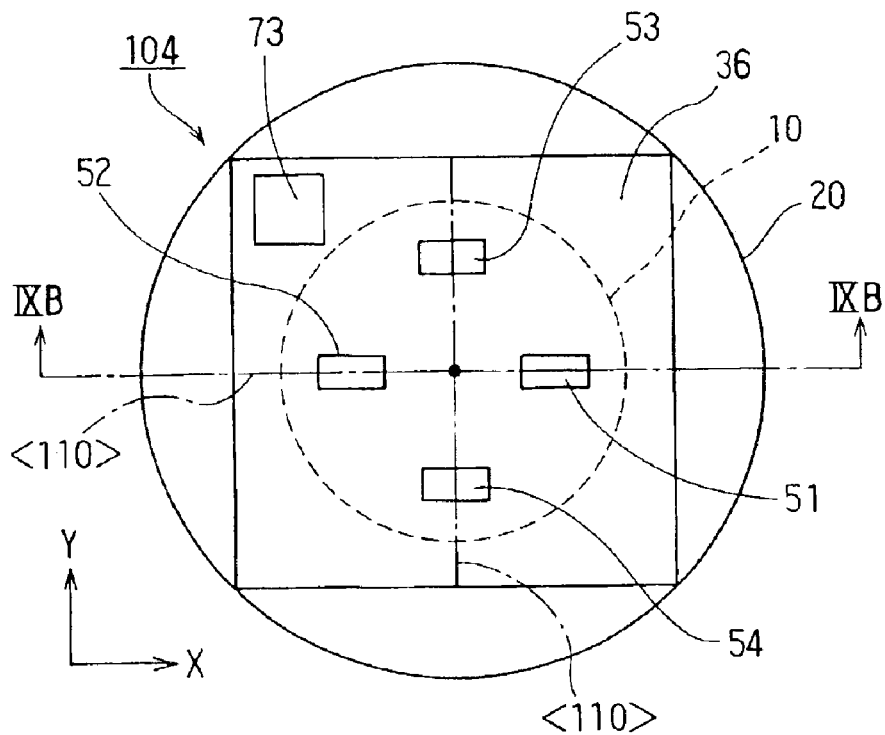
FIG. 9A is a plan view of a pressure detection device manufactured with a method according to a second embodiment of the present invention.
Figure 9B:
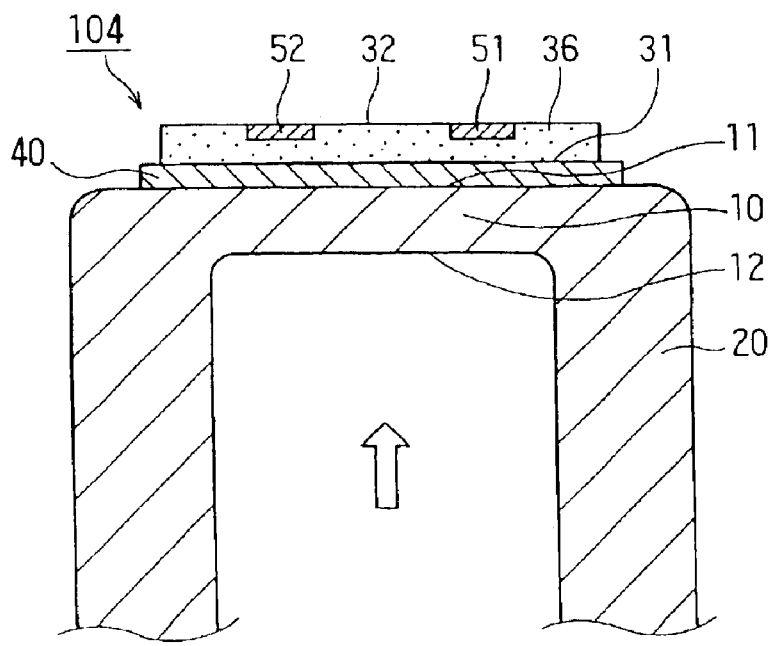
FIG. 9B is a cross-sectional view of the device of FIG. 9A taken along the line IXB—IXB in FIG. 9A.
Figure 10:
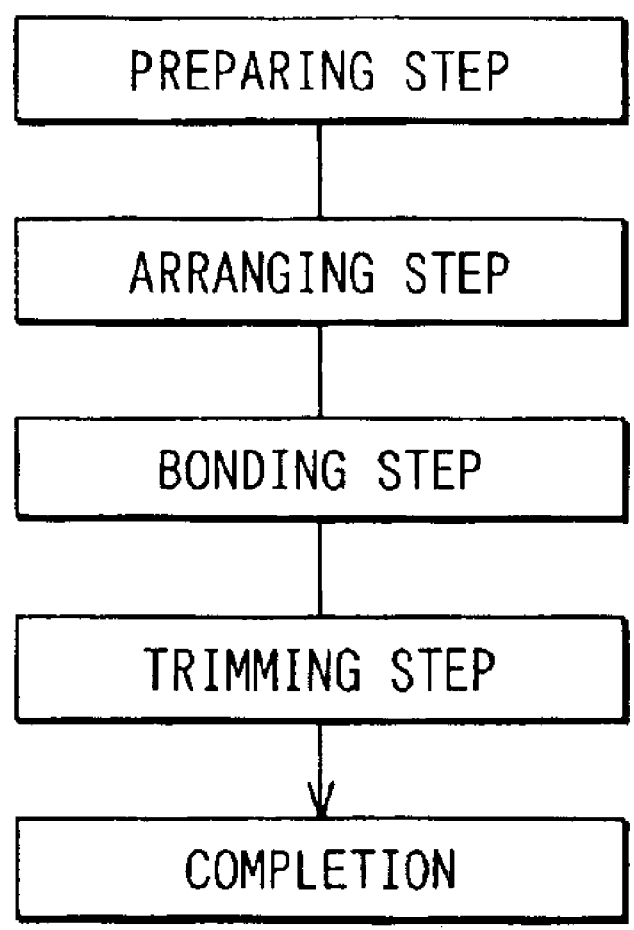
FIG. 10 is a flow chart showing the manufacturing flow for the pressure detection device of FIGS. 9A and 9B.

As shown in FIGS. 9A and 9B, a dynamic quantity detection device according to a second embodiment is an intelligent pressure detection device 104, which has a similar structure to the pressure detection device 102 of FIGS. 3A and 3B. Although not illustrated in the figure, a semiconductor chip 36 of FIGS. 9A and 9B has a similar cross-sectional structure, which is shown in FIG. 4, to that of the semiconductor chip 34 of FIGS. 3A and 3B. However, the pressure detection device 104 of FIGS. 9A and 9B is different in manufacturing method from the pressure detection device 102 of FIGS. 3A and 3B, as shown in the process flow of FIG. 10. The pressure detection device 104 of FIGS. 9A and 9B is manufactured according to the process flow of FIG. 10.

Firstly, as a preparing step, a semiconductor chip 36 that includes gauges 51, 52, 53, 54 and processing circuit elements, which are ones such as a transistor Tr1, Tr2 and a trimming resistor 83, and a metal stem 20 are prepared. Then, as an arranging step, a glass layer 40 that is made of, for example, a low melting point glass is placed at a predetermined area on a first surface 11 of a diaphragm 10 of the metal stem 20, and the semiconductor chip 36 is placed on top of the glass layer 40. Then, as a bonding step, the combined unit 20, 40, 36 is transferred into a sintering furnace, which is not shown in the figure, and the glass layer 40 is sintered at approximately 400° C. to bond the semiconductor chip 36 to the metal stem 20.

The above steps are similar to those for the pressure detection device 102 of FIGS. 3A and 3B. In the manufacturing process of the pressure detection device 104 of FIGS. 9A and 9B, however, as a trimming step, the trimming resistor 83 is trimmed to adjust the resistance thereof using a well-known trimming method in order to compensate the characteristic changes of the transistors Tr1, Tr2, which are caused during the bonding step. With the above steps, the pressure detection device 104 of FIGS. 9A and 9B is formed.

The above manufacturing process of the pressure detection device 104 of FIGS. 9A and 9B is characterized in that the trimming resistor 83 is trimmed to adjust the resistance thereof in order to compensate the characteristic changes of the transistors Tr1, Tr2 after the bonding step. Therefore, even if the hydrogen atoms bonded to the silicon atoms at the interface between the surface of the substrate 80 and the silicon oxide film 86 move away from the silicon atoms and the hydrogen ions absorbed in the silicon oxide film 86 migrate toward the passivation film 87 or get outgassed into the atmosphere and electric characteristics of the transistors Tr1, Tr2 change after the bonding step, it is possible to permit the operational amplifier made up of the transistors Tr1, Tr2 to operate preferably after the trimming step.

The scope of the present invention is not limited to the above pressure detection devices and may be applied to various other dynamic quantity detecting devices such as an acceleration sensor. In addition, the manufacturing methods and the arrangement of the gauges 51, 52, 53, 54 and the processing circuit area 71, 72, 73 may be modified in various manners.

For example, when the processing circuit area 72 of FIG. 8A is arranged such that the sides thereof have an angle of 45 degrees with respect to the two crystallographic axes of <110> as shown in FIG. 8A, the photomask patterns for the processing circuit area 72 of FIG. 8A may be made by changing the data for the photomask patterns for the processing circuit area 71 of FIG. 3A to rotate the patterns by about 45 degrees.

Alternatively, for example, it is possible to use a silicon wafer having a face orientation of (100) and an orientation flat that an angle of 45 degrees with respect to crystallographic axis of <110>. In that case, the photomask patterns for the processing circuit area 72 of FIG. 8A can be made by only shifting the photomask patterns of the processing circuit area 71 of FIG. 3A without changing the data for the photomask patterns of the processing circuit area 71 of FIG. 3A to rotate the patterns. Therefore, the manufacturing process of the photomasks for the processing circuit area 72 of FIG. 8A can be simplified.

Figure 11A:
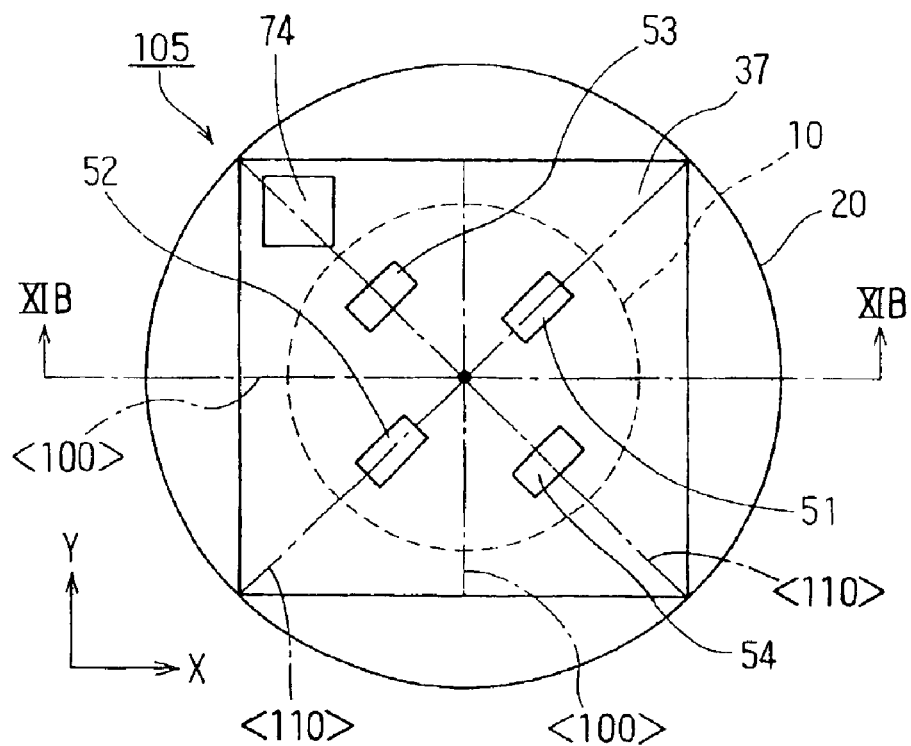
FIG. 11A is a plan view of a variation of the pressure detection device manufactured with the method according to the first embodiment or the second embodiment.
Figure 11B:
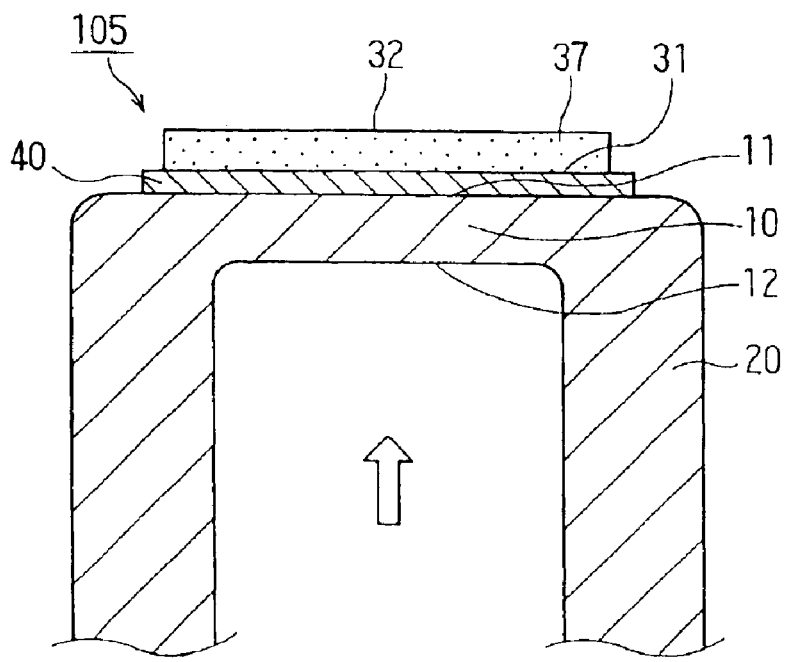
FIG. 11B is a cross-sectional view of the device of FIG. 11A taken along the line XIB—XIB in FIG. 11A.

The processing circuit area 72 of FIG. 8A is arranged such that the sides thereof have an angle of 45 degrees with respect to the sides of the semiconductor chip 35, which are parallel to crystallographic axes of <110>. alternatively, in a pressure detection device 105 shown in FIGS. 11A and 11B, the sides of a processing circuit area 74 are parallel to the sides of the semiconductor chip 37, which are parallel to crystallographic axes of <100>, while the gauges 51, 52, 53, 54 are arranged such that the longitudinal directions of them have an angle of 45 degrees with respect to the sides of the semiconductor chip 37, in other words, the longitudinal directions of them are parallel to crystallographic axes of <110>. In other aspects, the pressure detection device 105 of FIGS. 11A and 11B has the same structure as the pressure detection device 102 of FIGS. 3A and 3B.

The semiconductor chip 34 is annealed by heating on the heater panel 91 while a gas containing hydrogen is supplied into the annealing chamber 90 to supply-hydrogen ions to the silicon oxide film 86 after the bonding step in the manufacturing process of the pressure detection device 102 of FIGS. 3A and 3B. However, it is possible to supply hydrogen ions to the silicon oxide film 86 by thermally decomposing hydrogen compounds, or decomposing hydrogen compounds using plasma or ultraviolet.

What is claimed is:

1. A method for manufacturing a dynamic quantity detection device that is formed by bonding a semiconductor chip that includes a detection element for detecting a dynamic quantity to a stand using a bonding layer, the method comprising:

forming a semiconductor chip that includes a detection element used for correlating a dynamic quantity to be detected to an electric quantity and a plurality of processing circuit elements used for making up a circuit that processes the electric quantity;

placing a bonding layer on a stand;

placing the semiconductor chip on the bonding layer;

bonding the semiconductor chip to the stand by sintering the bonding layer; and annealing the semiconductor chip in an atmosphere that contains hydrogen in order to compensate for hydrogen removed from the processing circuit element during the bonding of the semiconductor chip.

2. The method according to claim 1, wherein the processing circuit elements includes at least one of a transistor and a trimming resistor.

3. The method according to claim 1, wherein the bonding layer is made of a low melting point glass.

4. The method according to claim 1, wherein the stand includes a diaphragm, which is deformable in response to the dynamic quantity, wherein the semiconductor chip is located above the diaphragm.

5. The method according to claim 1, wherein an amount of hydrogen compensated for during the annealing is approximately equal to the hydrogen removed from the processing circuit element during the bonding of the semiconductor chip.

6. A method for manufacturing a dynamic quantity detection device that is formed by bonding a semiconductor chip that includes a detection element for detecting a dynamic quantity to a stand using a bonding layer, the method comprising:

forming a semiconductor chip that includes a detection element used for correlating a dynamic quantity to be detected to an electric quantity and a plurality of processing circuit elements used for making up a circuit that processes the electric quantity;

placing a bonding layer on a stand;

placing the semiconductor chip on the bonding layer;

bonding the semiconductor chip to the stand by sintering the bonding layer; and compensating a change in a characteristic of one of the processing circuit elements by trimming, wherein the change is caused during the bonding the semiconductor chip.

7. The method according to claim 6, wherein the processing circuit elements includes at least one of a transistor and a trimming resistor.

8. The method according to claim 6, wherein the compensating the change includes trimming a resistor to adjust a resistance of the resistor, wherein the resistor is one of the processing circuit elements.

9. The method according to claim 6, wherein the bonding layer is made of a low melting point glass.

10. The method according to claim 6, wherein the stand includes a diaphragm, which is deformable in response to the dynamic quantity, and wherein the semiconductor chip is located above the diaphragm.

* * * * *